(12) United States Patent
Chen et al.

(10) Patent No.: US 11,426,793 B2
(45) Date of Patent: *Aug. 30, 2022

(54) METHOD OF FABRICATING HIGH-POWER MODULE

(71) Applicant: National Cheng Kung University, Tainan (TW)

(72) Inventors: In-Gann Chen, Tainan (TW); Hung-Cheng Chen, Tainan (TW); Chia-Ming Yang, Tainan (TW); Steve Lien-Chung Hsu, Tainan (TW); Chang-Shu Kuo, Tainan (TW)

(73) Assignee: National Cheng Kung University, Tainan (TW)

( * ) Notice: Subject to any disclaimer, the term of this patent is extended or adjusted under 35 U.S.C. 154(b) by 940 days.

This patent is subject to a terminal disclaimer.

(21) Appl. No.: 16/207,343

(22) Filed: Dec. 3, 2018

(65) Prior Publication Data

US 2020/0171578 A1     Jun. 4, 2020

(51) Int. Cl.
*B22F 7/06*     (2006.01)
*H01L 23/373*     (2006.01)
(Continued)

(52) U.S. Cl.
CPC ............... *B22F 7/064* (2013.01); *C09K 5/14* (2013.01); *H01L 23/3736* (2013.01); *H01L 24/27* (2013.01); *H01L 24/29* (2013.01); *H01L 24/32* (2013.01); *H01L 24/83* (2013.01); *B22F 2301/255* (2013.01); *H01L 2224/2732* (2013.01); *H01L 2224/2919* (2013.01); *H01L 2224/29139* (2013.01); *H01L 2224/32245* (2013.01); *H01L 2224/83048* (2013.01); *H01L 2224/8384* (2013.01); *H01L 2224/83192* (2013.01); *H01L 2224/83203* (2013.01);
(Continued)

(58) Field of Classification Search
CPC .......................... B22F 7/064; H01L 23/3736
USPC ........................................................ 419/23
See application file for complete search history.

(56) References Cited

U.S. PATENT DOCUMENTS

| 9,902,862 | B2 * | 2/2018 | Hsu ........................ H01B 1/22 |
| 2016/0324031 | A1 * | 11/2016 | Fujiwara ................ B32B 9/007 |
| 2018/0009998 | A1 * | 1/2018 | Hsu ........................ H01B 1/22 |

FOREIGN PATENT DOCUMENTS

WO    WO-2014118585 A2 *   8/2014 ............ B05B 5/005

* cited by examiner

*Primary Examiner* — Weiping Zhu
(74) *Attorney, Agent, or Firm* — Demian K. Jackson; Jackson IPG PLLC

(57) ABSTRACT

A method is provided to fabricate a high-power module. A non-touching needle is used to paste a slurry on a heat-dissipation substrate. The slurry comprises nano-silver particles and micron silver particles. The ratio of the two silver particles is 9:1~1:1. The slurry is pasted on the substrate to be heated up to a temperature kept holding. An integrated chip (IC) is put above the substrate to form a combined piece. A hot presser processes thermocompression to the combined piece to form a thermal-interface-material (TIM) layer with the IC and the substrate. After heat treatment, the TIM contains more than 99 percent of pure silver with only a small amount of organic matter. No volatile organic compounds would be generated after a long term of use. No intermetallic compounds would be generated while the stability under high temperature is obtained. Consequently, embrittlement owing to procedure temperature is dismissed.

16 Claims, 4 Drawing Sheets

Pasting nano-silver-based slurry on substrate by using non-touching needle    101

Heating up nano-slurry and holding temperature    102

Obtaining combined piece by putting integrated chip (IC) on substrate    103

Obtaining TIM layer through thermocompression    104

(51) Int. Cl.
 *H01L 23/00* (2006.01)
 *C09K 5/14* (2006.01)
(52) U.S. Cl.
 CPC ............... *H01L 2224/83908* (2013.01); *H01L 2924/20106* (2013.01); *H01L 2924/20107* (2013.01); *H01L 2924/20108* (2013.01)

(A)

*S.D.=Standard Daviation (B)

METHOD OF FABRICATING HIGH-POWER MODULE

TECHNICAL FIELD OF THE INVENTION

The present invention relates to fabricating a high-power module; more particularly, to containing a nano-silver-based slurry having different ratios of silver particles of more than two granular sizes, where a novel non-touching needle dispensing technology is used to avoid substrate from damage; and a thermal-interface-material (TIM) layer is formed through thermocompression with sintering.

DESCRIPTION OF THE RELATED ARTS

In recent years, awareness of environmental protection rises, so that lead(Pb)-free electronic packaging materials are environmental trends in the future. The current commercial TIM for a silicon-based power module mainly uses a tin/silver/copper (SnAgCu) alloy as the encap-sulating material. However, the power module for the next generation uses silicon carbide (SiC) and gallium nitride (GaN) as the main material and is operated at a temperature higher than the current silicon-based high-power module (150 Celsius degrees (° C.)). Under such a high temperature, the SnAgCu alloy may quite possible to form easily-cracked intermetallic compounds. The shear stress of the high-power module accumulated under a long term of thermal cycling will cause the cracking of the intermetallic compound and further fails the module due to poor heat dissipation.

After referring to hundreds of patents, the prior arts are summarized as follows:

1. For welding: For reducing the dosage of Pb, cadmium and other hazardous substances, Pb-free solder alloys are invented, which are composed of zinc (Zn) as the main component and aluminum (Al) as the alloy metal and used in mechanical connections or electronic applications. Briefly, they are eutectic Pb-free solder alloys containing zinc as the main component and aluminum as the alloy metal.

2. For solar-energy related welding: Welded laminate combinations are made, which are composed of welded laminates of metal-nanoparticle sintered layers (containing silver nanoparticles with average granular diameters of 1 micrometer (μm)~100 nanometers (nm)), binder layers, barrier layers containing metallic oxide particles and AuSn alloy solders. The laminate combinations can be photoelectric conversion components used in solar batteries. In short, they are welded laminate combinations.

3. For electrode: Conductive silver pastes are made, which are composed of micron-sized silver powders, silver salts, aminophenol-type epoxy compounds and curing agents. By using the silver salts and the aminophenol-type epoxy compounds, characteristics of good workability and high conductivity are obtained at the same time under a lower manufacturing cost. Briefly, they are conductive silver pastes and conductive silver layers.

4. For solar-energy related electrode: Silver pastes for forming electrodes are made, which are composed of silver powders, glass frit powders, organic binders and carbon black. They have good printability, outstanding electrical properties and good energy conversion efficiencies to be used as electrodes for solar batteries. In short, they are silver pastes for forming electrodes together with the fabricating methods.

As is described above, modern related industries use technologies of spraying, non-thermocompression and non-nanoscaled silver pastes having silver contents less than 90 percent (%). Therein, the spraying technology applies needle-dispensing transfer. A needle carries a slurry to finish pasting by touching a heat-dissipation substrate, which is a related technology already revealed. However, this needle dispensing probe is a touching dispensing, which is vulnerable to damage the substrate or the coating layer on the substrate surface owing to the too big height difference on the surface of the heat-dissipation substrate. The later part of etching solder devices in circuit will be affected and probability of damaging the needle under a long term of use becomes high with production cost increased.

The two most widely used materials in electronic packaging industries for heterojunction are Pb and Sn alloys. Because Pb can damage human nervous system and interfere with fetal development, people in the whole world are trying to find Pb-free welding materials currently. However, the main ingredient of a Pb-free solder is SnAgCu alloy, which is vulnerable to form intermetallic compounds ($Cu_6Sn_5$ and $Cu_3Sn$) at high temperature. Once the intermetallic compound is formed, the mechanical strength of contact under high temperature (>150° C.) is reduced to one-third of the original and holes may be easily formed in a long term of heat cycle, which makes the welding strength weaker. Furthermore, after the holes are formed, the interface thermal resistances of heat-dissipation fins and integrated circuit (IC) devices in the high-power module are increased, which lead to elimination in heat dissipation and fails the high-power module at last.

Hence, the prior arts do not fulfill all users' requests on actual use.

SUMMARY OF THE INVENTION

The main purpose of the present invention is to obtain a TIM layer having only a small amount of organic matter (<1%) after heat treatment with more than 99 percent of pure silver contained within, where no volatile organic compounds would be generated after a long term of use while stability is obtained under high temperature (<800° C.); and no intermetallic compounds are generated while embrittlement owing to procedure (environment) temperature is dismissed.

Another purpose of the present invention is to use pure silver to obtain a TIM layer, where the highly pure silver is used as a material for heterojunction, whose thermal conductivity is twice as much as that of an alloy of SnAgCu (i.e. Pb-free solder) and which can replace Pb-free solders like the SnAgCu alloy and the alloys of Pb/Sn and Ag/Pb/Sn (conventional solders).

Another purpose of the present invention is to obtain a specific ratio of nano-silver particles to micron silver particles, where the major constituent silver particles are nano-silver particles having sizes smaller than 100 nm; and, hence, the heat treatment is processed at a temperature below 250° C. to avoid electronic components from damage by high temperature in a packaging process.

Another purpose of the present invention is to use a novel non-touching needle dispensing technology to avoid substrate from damage.

Another purpose of the present invention is to add a specifically-designed organic silver-ion compound as a silver precursor, where the density of the TIM layer is effectively increased after sintering, and, thus, the thermal and mechanical properties are improved and the material cost is effectively reduced.

To achieve the above purposes, the present invention is a method of fabricating a high-power module, comprising steps of: (a) providing a non-touching needle dispensing device to paste a nano-silver-based slurry on a heat-dissipation substrate by a non-touching needle coordinated with automatic feedback of a voltage measured, where the nano-silver-based slurry comprises 65~70 weight percent (wt %) of silver-based metallic particles, 5~10 wt % of an organic silver-ion compound, less than 5 wt % of an organic additive and 30~40 wt % of a first solvent; where the silver-based metallic particles comprises nano-silver particles as primary silver particles with surfaces protected by organic acid and granular sizes smaller than 100 nm; and micron silver particles as secondary silver particles with granular sizes of 500~1000 nm; where the ratio of the nano-silver particles to the micron silver particles is 9:1~1:1; and where the non-touching needle dispensing device has a set of sensors to form an automatically-feedbacking control system comprising weight sensors, capacitors and resistors; (b) heating up the nano-silver-based slurry pasted on the heat-dissipation substrate to a temperature and holding the temperature; (c) disposing an IC above the nano-silver-based slurry of the heat-dissipation substrate to obtain a combined piece; and (d) obtaining a hot presser to process thermocompression to the combined piece with the nano-silver-based slurry sintered to form a TIM layer with the IC and the heat-dissipation substrate, where the hot presser uses a pressing pressure of 1~10 mega-Pascals and a heating temperature of 210~300° C.; and the pressing pressure and the heating temperature is held 30~120 minutes before processing cooling down to a room temperature. Accordingly, a novel method of fabricating a high-power module is obtained.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

The following description of the preferred embodiment is provided to understand the features and the structures of the present invention.

Please refer to FIG. 1 to FIG. 4, which are a flow view showing a preferred embodiment according to the present invention; a view showing a non-touching needle coordinated with automatic feedback of a voltage measured; a view showing a TIM layer photographed by SEM after processing thermocompression; and a view showing a comparison to a conventional touching dispensing technology. As shown in the figures, the present invention is a method of fabricating a high-power module. Between an integrated circuit (IC) (heat source) and a heat-dissipation substrate, a nano-silver-based slurry is pasted on the heat-dissipation substrate through a transfer technology of screen printing, needle dispensing or blade coating. Therein, the heat-dissipation substrate is a substrate of an alloy of silver, copper, gold or nickel; or a substrate of a ceramic or silicon oxide coated with a layer of an alloy of silver, gold, nickel or titanium, or coated with a layer of a nitride.

Figure 3:
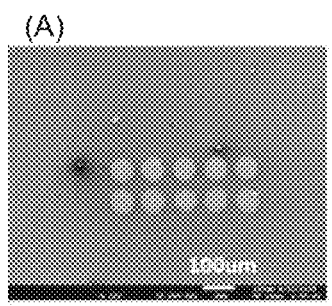
FIG. 3 is the view showing the thermal-interface-material (TIM) layer photographed by scanning electron microscope (SEM) after processing the thermocompression.
Figure 3:
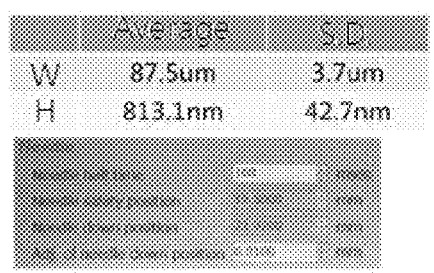
Figure 3:
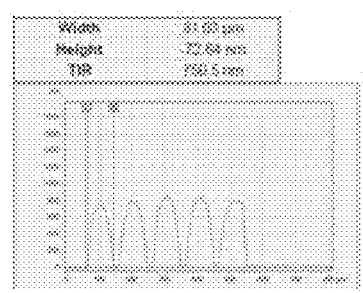
Figure 3:
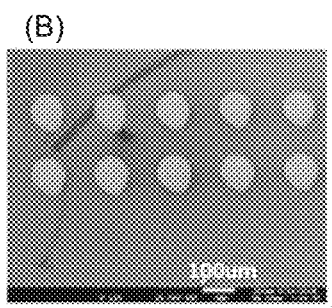
Figure 3:
Figure 3:
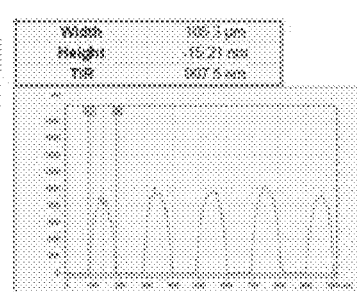

Based on the transfer technology of needle dispensing, the present invention mainly uses a non-touching needle dispensing technology, where a needle carries a slurry and, once the slurry touches the substrate, the needle completes pasting without touching the substrate. In FIG. 3, the upper diagram (A) shows that the substrate and the coating layer on the surface are not destroyed, because the needle used in the present invention avoids touching the substrate. Therefore, the needle avoids damage for a long term of use and the pasted area is reduced. As compared to the conventional touching needle dispensing technology shown in the lower diagram (B), the present invention reduces the pasted area for 30 percent (%).

Figure 1:
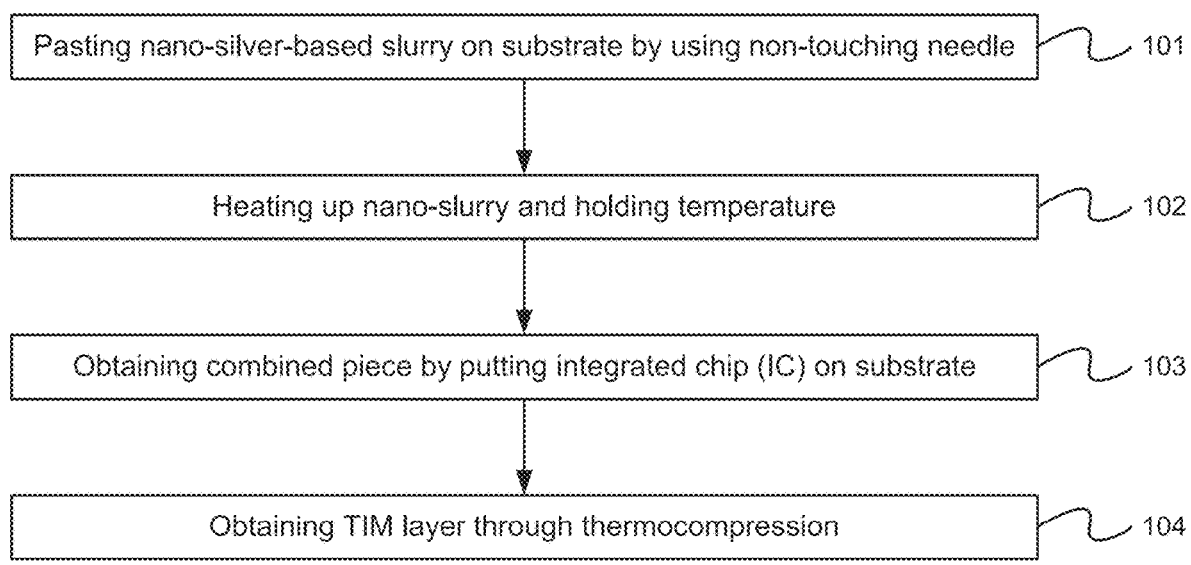
FIG. 1 is the flow view showing the preferred embodiment according to the present invention.

Hence, the present invention is proposed to cope with the high operating temperature for the next-generation power module; and a novel thermal interface material is provided as a key material for the next-generation power module. In FIG. 1, the method for fabricating a high-power module is shown, comprising the following steps:

(a) Pasting nano-silver-based slurry on substrate by using non-touching needle 101: A non-touching needle dispensing device is provided, which has a non-touching needle coordinated with automatic feedback of a voltage measured. A nano-silver-based slurry (not shown in the figure) is pasted on a heat-dissipation substrate 2. By weight percents (wt %), the nano-silver-based slurry comprise:

(i) 65~70 wt % of silver-based metallic particles,
  where the silver-based metallic particles are formed through chemical synthesis and are mixed silver particles of more than two granular sizes;
  where the silver-based metallic particles comprises nano-silver particles as primary silver particles with surfaces protected by organic acid (e.g. heptatonic acid or propionic acid) and with granular sizes smaller than 100 nanometers (nm); and micron silver particles as secondary silver particles with granular sizes of 500~1000 nm; and
  where the ratio of the nano-silver particles to the micron silver particles is 9:1~1:1;

(ii) 5~10 wt % of an organic silver-ion compound,
  where the organic silver-ion compound is functioned as a silver precursor mainly containing a functional group of long-carbon-chain fatty acid and silver ion and can be silver 2-ethylhexanoate;

(iii) less than 5 wt % of an organic additive,
  where the organic additive can be ethyl cellulose or glycerol;

(iv) 30~40 wt % of a first solvent,
  where the first solvent can be α-terpineol; and (v) less than 3 wt % of a second solvent,
  where the second solvent is mainly an organic solvent of a tertiary alcohol or a keto alcohol, which remains in a liquid state at 0~25 Celsius degrees (° C.); and can be 1-hydroxybutanone (i.e. acetol), 4-hydroxy-4-methyl-2-pentanone (i.e. diacetone alcohol), 2-methyl-2-butanol or 2-propanol.

Figure 2:
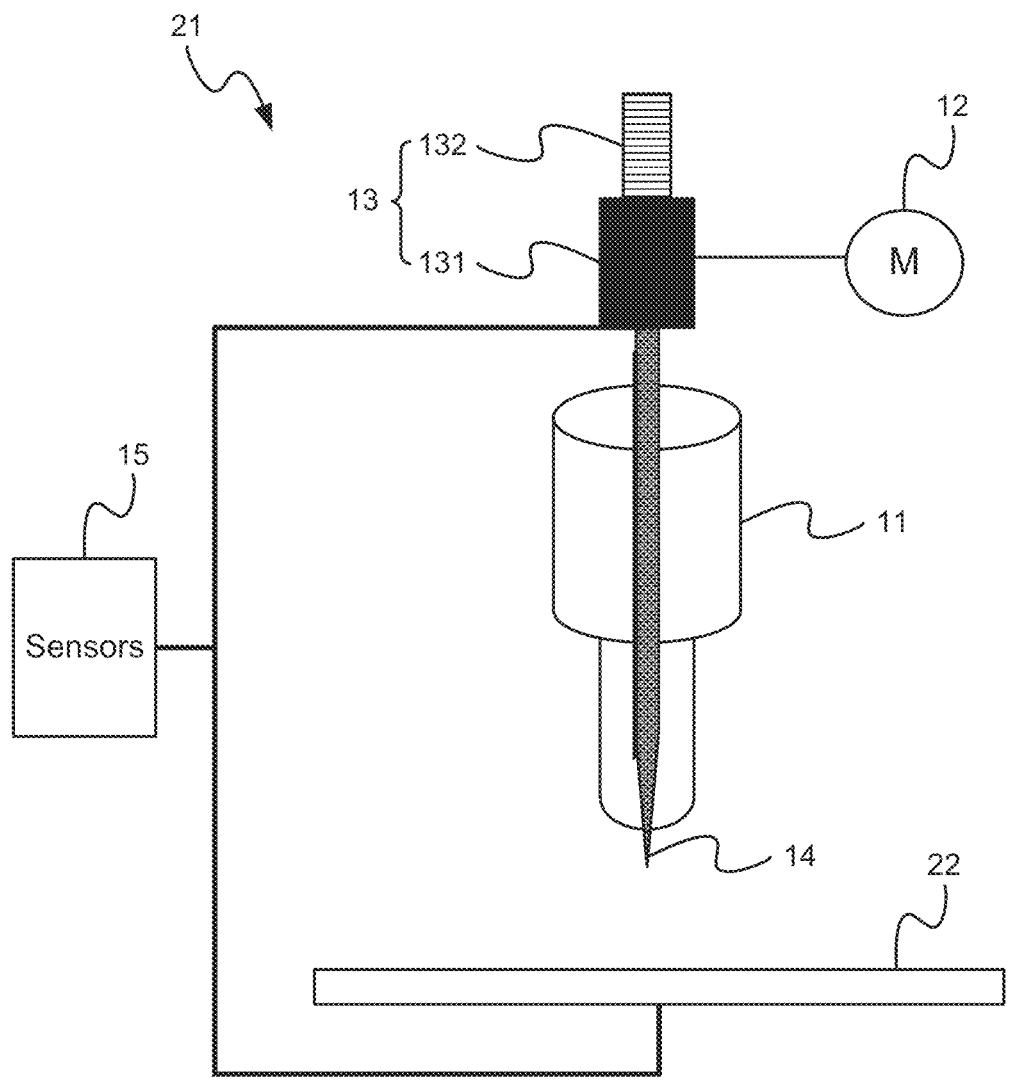
FIG. 2 is the view showing the non-touching needle coordinated with the automatic feedback of the voltage measured.

In FIG. 2, the non-touching needle dispensing device 1 comprises a container 11, which contains the nano-silver-based slurry; a driving device 12, which is set at a side of the container 11 and has a stepping motor as a power source for pressing; a pressing piston 13, which is set on the container 11 and is electrically connected with the driving device 12; and has a piston head 131 at an end and a connecting rod 132 at another end to move up and down driven by the driving device 12; a needle 14, which is set at bottom of the container 11; and a set of sensors 15, which forms an automatically-feedbacking control system comprising weight sensors, capacitors and resistors. The non-touching needle dispensing device 1 has the following purpose: At the exact moment when the nano-silver-based slurry at a front end of the needle 14 touches the heat-dissipation substrate 2, a capacitance (resistance) measured by the set of sensors 15 is changed and the non-touching needle dispensing device 1 is thus stopped from needling-down for avoiding substrate damage happened in the conventional touching dispensing technology owing to the too big height difference on the surface of the heat-dissipation substrate 2, as shown in FIG. 3.

(b) Heating up nano-slurry and holding temperature 102: The nano-silver-based slurry pasted on the heat-dissipation substrate 2 is heated up to a temperature of 55~85° C. and the temperature is held 5~10 min.

(c) Obtaining combined piece by putting integrated chip (IC) on substrate 103: An IC is put above the nano-silver-based slurry of the heat-dissipation substrate 2 to form a combined piece.

(d) Obtaining TIM layer through thermocompression 104: A hot presser is used to process thermocompression for pressing and heating the combined piece. The nano-silver-based slurry is sintered to form a TIM layer with the IC and the heat-dissipation substrate 2. Therein, the operating parameters of the hot presser are a pressing pressure of 1~10 mega-Pascals and a heating temperature of 210~300° C.; and the pressing pressure and the heating temperature is held 30~120 minutes (min) before processing cooling down to a room temperature. If not being pressed, the combined piece is heated up to a temperature of 210~300° C. and the temperature is held 30~120 min before processing cooling down to a room temperature. Thus, a novel method of fabricating a high-power module is obtained.

Figure 4:
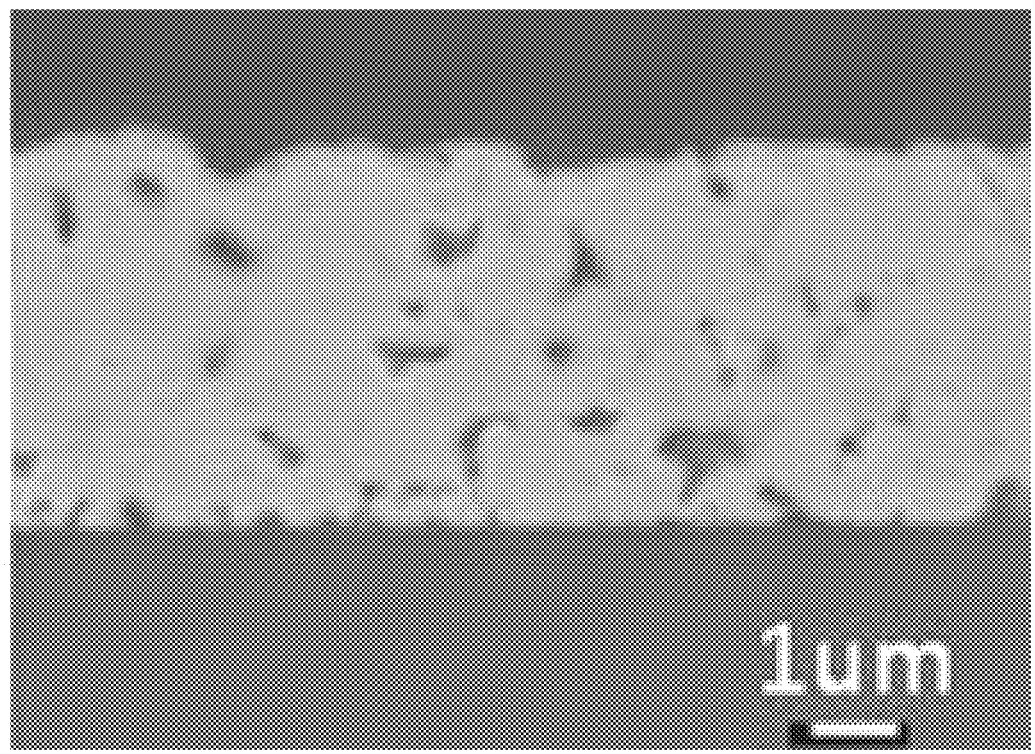
FIG. 4 is the view showing the comparison to the conventional touching dispensing technology.

After processing the thermocompression, the TIM layer with the IC and the heat-dissipation substrate 2 has a component of silver more than 90%, a porosity less than 15% and a thickness of 0.5~10 micrometers (μm), as shown in FIG. 4. If the thermocompression is processed yet the combined piece is not pressed, the TIM layer with the IC and the heat-dissipation substrate 2 has a component of silver more than 90%, a porosity less than 25% and a thickness of 1~15 μm.

Thus, the present invention has the following effects:

1. The TIM layer used in the present invention will not generate any intermetallic compound. Hence, embrittlement owing to procedure (environment) temperature is dismissed with stability obtained even at high temperature (<800° C.).

2. The TIM layer used in the present invention contains only a small amount of organic matter (<1%) after heat treatment. More than 99% contained within is pure silver. No volatile organic compounds (VOC) would be generated after a long term of use.

3. The TIM layer is pure silver. The highly pure silver is used as a material for heterojunction, whose thermal conductivity is twice as much as that of an alloy of tin/silver/copper (SnAgCu) (i.e. lead(Pb)-free solder) as shown in Table 1.

TABLE 1

| | SnAgCu solder | Silver slurry |
|---|---|---|
| Conductivity (mΩ-cm) | 0.010~0.015 | <0.001 |
| Thermal conductivity (W/m-K) | 60 | >200 |

4. The present invention does not contain any toxic substances, like Pb, cadmium, halogen, etc.

5. Modern high-power modules have working temperatures reaching 150° C.; yet, high-power modules for the next-generation will have their working temperatures reaching 200° C. The TIM used in the present invention is pure silver which can replace Pb-free solders like the SnAgCu alloy and the conventional alloys of Pb/Sn and Ag/Pb/Sn.

6. The ratio of nano-silver particles to micron silver particles in the present invention is 9:1~1:1; and the major constituent silver particles are nano-silver particles having sizes smaller than 100 nm. Hence, the heat treatment is processed at a temperature below 250° C. to avoid electronic components from damage by high temperature in a packaging process.

7. The present invention uses a novel non-touching needle dispensing technology to avoid substrate from damage.

8. The present invention adds a specifically-designed organic silver-ion compound as a silver precursor for effectively increasing the density of the TIM layer after sintering. Thus, the thermal and mechanical properties are improved and the material cost is effectively reduced.

To sum up, the present invention is a method of fabricating a high-power module, where a TIM contains only a small amount of organic matter (<1%) after heat treatment and more than 99% contained within is pure silver; no VOCs would be generated after a long term of use while stability is obtained under high temperature (<800° C.); no intermetallic compounds are generated while embrittlement owing to procedure (environment) temperature is dismissed; and highly pure silver is used as a material for heterojunction whose thermal conductivity is twice as much as that of a SnAgCu alloy (i.e. Pb-free solder).

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A method of fabricating a high-power module comprising steps of:

(a) providing a non-touching needle dispensing device to paste a nano-silver-based slurry on a heat-dissipation substrate by a non-touching needle coordinated with automatic feedback of a signal measured corresponding to proximity of the needle and the substrate to inhibit contact therebetween, wherein said nano-silver-based slurry comprises 65~70 weight percent (wt %) of silver-based metallic particles, 5~10 wt % of an organic silver-ion compound, less than 5 wt % of an organic additive and 30~40 wt % of a first solvent; wherein said silver-based metallic particles comprises nano-silver particles as primary silver particles with surfaces protected by organic acid and with granular sizes smaller than 100 nanometers (nm); and micron silver particles as secondary silver particles with granular sizes of 500~1000 nm; wherein the ratio of said nano-silver particles to said micron silver particles is 9:1~1:1; and wherein said non-touching needle dispensing device has a set of sensors to form an automatically-feedbacking control system comprising weight sensors, capacitors, and resistors;

(b) heating up said nano-silver-based slurry pasted on said heat-dissipation substrate to a temperature and holding said temperature;

(c) disposing an integrated chip (IC) above said nano-silver-based slurry of said heat-dissipation substrate to obtain a combined piece; and (d) obtaining a hot presser to process thermocompression to said combined piece with said nano-silver-based slurry sintered to form a thermal-interface-material (TIM) layer with said IC and said heat-dissipation substrate, wherein said hot presser uses a pressing pressure of 1~10 mega-Pascals and a heating temperature of 210~300 Celsius degrees (° C.); and said pressing pressure and said heating temperature is held 30~120 minutes (min) before processing cooling down to a room temperature.

2. The method according to claim 1, wherein said heat-dissipation substrate is selected from a group consisting of a substrate of an alloy and a substrate of a base material coated with a coating layer; said alloy is an alloy of a metal selected from a group consisting of silver, copper, gold and nickel; said base material is selected from a group consisting of a ceramic and silicon oxide; and said coating layer is a layer coated with a material selected from a group consisting of another alloy and a nitride and said another alloy is an alloy of another metal selected from a group consisting of silver, gold, nickel and titanium.

3. The method according to claim 1, wherein, in step (a), said nano-silver-based slurry is pasted on said heat-dissipation substrate through a method selected from a group consisting of screen printing and blade coating.

4. The method according to claim 1, wherein said silver-based metallic particles are obtained through chemical synthesis and are mixed silver particles of more than two granular sizes.

5. The method according to claim 1, wherein said organic acid is selected from a group consisting of heptanoic acid and propionic acid.

6. The method according to claim 1, wherein said organic silver-ion compound is a silver precursor mainly containing a functional group of long-carbon-chain fatty acid and silver ion.

7. The method according to claim 6, wherein said organic silver-ion compound is silver 2-ethylhexanoate.

8. The method according to claim 1, wherein said organic additive is selected from a group consisting of ethyl cellulose and glycerol.

9. The method according to claim 1, wherein said first solvent is α-terpineol.

10. The method according to claim 1, wherein said nano-silver-based slurry further comprises less than 3 wt % of a second solvent; and said second solvent is mainly an organic solvent of an alcohol selected from a group consisting of a tertiary alcohol and a keto alcohol, which keeps in a liquid state at 0~25° C.

11. The method according to claim 10, wherein said second solvent is selected from a group consisting of 1-hydroxybutanone (i.e. acetol), 4-hydroxy-4-methyl-2-pentanone (i.e. diacetone alcohol), 2-methyl-2-butanol and 2-propanol.

12. The method according to claim 1, wherein said non-touching needle dispensing device further comprises:

a container, wherein said container contains said nano-silver-based slurry; a driving device, wherein said driving device is disposed at a side of said container and is a power source of pressing;

a pressing piston, wherein said pressing piston is disposed on said container and is electrically connected with said driving device; and said pressing piston has a piston head at an end and a connecting rod at another end to move forward and backward driven by said driving device; and a needle, wherein said needle is disposed at bottom of said container; and wherein, at the exact moment when said nano-silver-based slurry disposed at a front end of said needle touches said heat-dissipation substrate, a capacitance or resistance measured by said set of sensors is changed and said non-touching needle dispensing device is thus stopped from needling-down and finishes pasting said nano-silver-based slurry.

13. The method according to claim 1, wherein, in step (b), said nano-silver-based slurry pasted on said heat-dissipation substrate is heated up to a temperature of 55~85° C. and said temperature is held 5~10 min.

14. The method according to claim 1, wherein, in step (d), after processing said thermocompression, said TIM layer with said IC and said heat-dissipation substrate has a component of silver more than 90 percent (%), a porosity less than 15% and a thickness of 0.5~10 micrometers (μm).

15. The method according to claim 14, wherein, in step (d), after processing said thermocompression, said TIM layer with said IC and said heat-dissipation substrate has a component of more than 99% silver and less than 1% organic matter.

16. The method according to claim 1, wherein, in step (d), after processing said thermocompression without pressing said combined piece, said TIM layer with said IC and said heat-dissipation substrate has a component of silver more than 90%, a porosity less than 25% and a thickness of 1~15 μm.

* * * * *